United States Patent [19]
Hartwig

[11] Patent Number: 6,121,777
[45] Date of Patent: *Sep. 19, 2000

[54] APPARATUS FOR DETECTING AT LEAST ONE PROPERTY OF A CABLE

[75] Inventor: Reinhold Hartwig, Mantel, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/515,890

[22] Filed: Aug. 16, 1995

[30] Foreign Application Priority Data

Aug. 16, 1994 [DE] Germany ............... 44 29 048

[51] Int. Cl.⁷ .................................. G01R 31/02
[52] U.S. Cl. .................................. 324/539
[58] Field of Search .................. 324/539, 540, 324/66

[56] References Cited

U.S. PATENT DOCUMENTS

| | | | |
|---|---|---|---|
| H1369 | 11/1994 | Verbin | 324/539 |
| 2,526,891 | 10/1950 | Meyerhoff | 324/539 |
| 4,998,069 | 3/1991 | Nguyen | 324/539 |

FOREIGN PATENT DOCUMENTS 25 52 900  5/1976  Germany.

OTHER PUBLICATIONS

Electrovert, Newark Catalog N. 10, Newark Electronics, 500 Pulaski Rd., Chicago, IL 60624, 312–784–5100, p. 685, 1989.

Strom, "Designing a Simple Flat Cable Tester", Jan., 1980, p. 33 and 33, Elec. Production.

*Primary Examiner*—Josie Ballato
*Assistant Examiner*—José Solis
*Attorney, Agent, or Firm*—Kenyon & Kenyon

[57] ABSTRACT

A method detects at least one property, such as cable length, of a multiconductor cable linked to a module by way of a logic and evaluation circuit within the module. The cable has at least one supply conductor connected by the module to a first potential and at least one signal conductor connected by the module to a second potential via a pull resistor. The supply conductor and the signal conductor will or will not be interconnected at the ends of the cable depending on whether given properties of the cable are present or not. The logic and evaluation circuit module detects the potential applied to the signal conductors and thereby determines the presence or absence of the cable properties to be determined.

9 Claims, 1 Drawing Sheet

1

APPARATUS FOR DETECTING AT LEAST ONE PROPERTY OF A CABLE

BACKGROUND OF THE INVENTION

The present invention relates to an apparatus for detecting at least one property of a multiconductor cable that is linked to a module. The property is detected by the module during its normal operation.

SUMMARY OF THE INVENTION

The present invention is to be able to detect a desired property of a multiconductor cable simply, reliably and cost-effectively. This is achieved by selectively connecting certain conductors of the cable to a specific potential when the desired property exists, and using a logic and evaluation circuit to determine whether such connections have been made. The presence or absence of such connections indicate the presence or absence of the cable properties that are to be determined.

The desired properties of the multiconductor cable are detected by employing a module of an electrical unit which has a logic and evaluation circuit and at least one communication interface connecting the module to the cable. The communication interface has a supply contact connected by a supply line to a first potential. It also has a signal contact connected by a signal line to the logic and evaluation circuit. A pull resistor also connects the signal line to a second potential.

The multiconductor cable is preassembled, and has at least a first and second conductor. It is provided at each end with a connecting element capable of connecting the conductors with the contacts of the communication interface. Depending on whether certain properties are present in the cable, the first and second conductors may be connected to each other. For example, if a cable is shorter than a certain critical length, it may be possible to transmit data across the cable at higher rates. A cable shorter than the critical length may have the two conductors connected to each other in the connecting elements.

When the cable is connected to the module, the first conductor is connected to the signal contact, while the second conductor is connected to the supply contact. If the conductors are connected to one another, they have the effect of short circuiting the first potential of the signal contact to the second potential of the supply contact, thus affecting the voltage present on the signal line, which is connected to the logic and evaluation circuit. If they are not connected, the signal line continues to feed a voltage equal to the first potential of the signal line into the logic and evaluation circuit. In this way, the logic and evaluation circuit may determine whether or not the cable is shorter than the critical length, and arrangements can be made to adjust the data rate accordingly.

DETAILED DESCRIPTION

Figure 1:
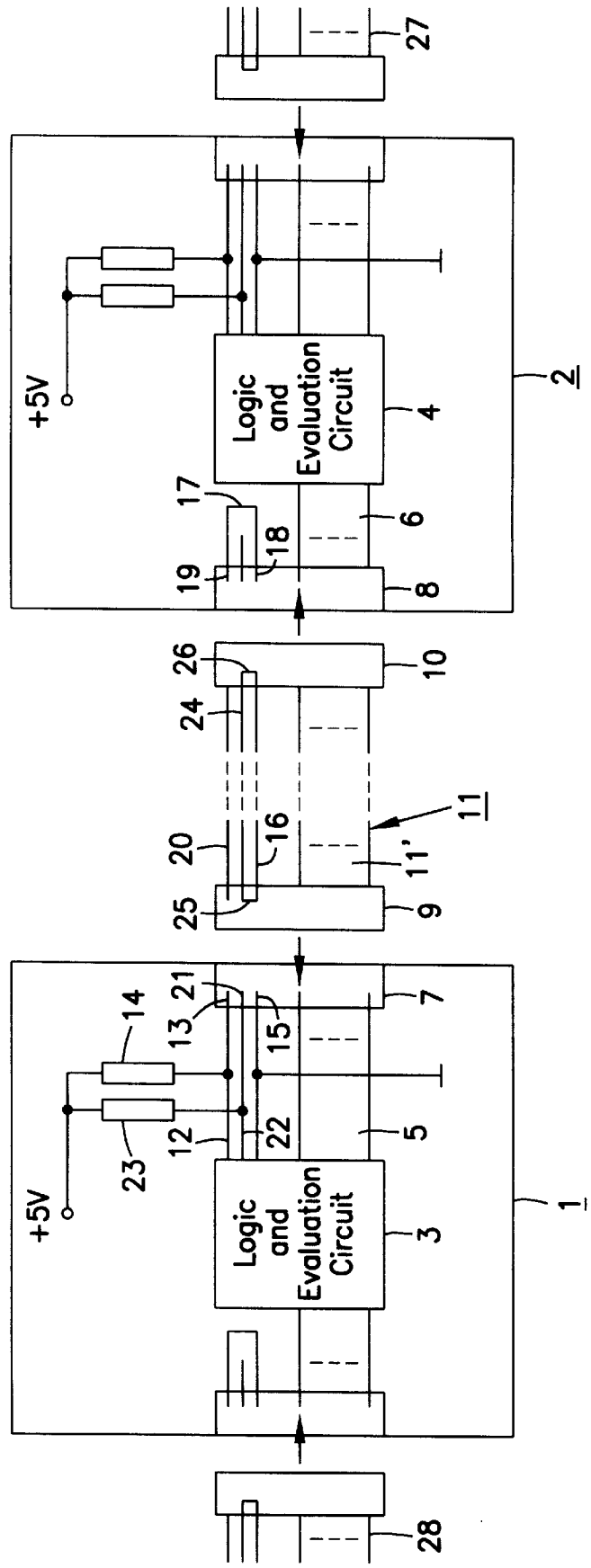
FIG. 1 shows two modules that are interconnected via a cable.

In accordance with FIG. 1, starting module 1 has a logic and evaluation circuit 3 and target module 2 has a logic and evaluation circuit 4. Logic and evaluation circuit 3 is connected to logic and evaluation circuit 4 via lines 5 and 6. Line 5 is connected to a connecting element 7 inside module 1, and line 6 is connected to a connecting element 8 inside module 2. Connecting elements 7 and 8 can be connected to mating connectors 9 and 10, respectively, which are arranged at the ends of a multiconductor cable 11. The multiconductor cable 11 can be advantageously preassembled with mating connectors 9 and 10.

The logic and evaluation circuits 3 and 4 are usually designed as Application Specific Integrated Circuits, as microprocessors, or as microcontrollers. During normal operation, they communicate with one another via lines 5 and 6 and the corresponding lines 11' of the multiconductor cable 11. Thus, the connecting elements 7 and 8 are communication interfaces.

In starting module 1, signal line 12 connects signal contact 13 of connecting element 7 to logic and evaluation circuit 3. Signal line 12 is also connected via pull resistor 14 to a potential of +5 volts. For as long as the mating connectors 9 and 10 of multiconductor cable 11 are not plugged into connecting elements 7 and 8, a potential of +5 volts is supplied to logic and evaluation circuit 3 via pull resistor 14 and signal line 12. This potential can be determined and detected by logic and evaluation circuit 3.

Starting module 1 also has supply contact 15, which is connected to ground. When mating connector 9 is plugged into the connector 7, supply conductor 16 of multiconductor cable 11 is connected to supply contact 15 and thus to ground. Signal conductor 20 of multiconductor cable 11 is connected to signal contact 13 and thus to +5 volts. When mating connector 10 is inserted into the connecting element 8, signal conductor 20 of multiconductor cable 11 is connected to ground by way of bridge circuit 17 as follows. Signal conductor 20 is connected to signal contact 19, which is connected via bridge circuit 17 to supply contact 18. Supply contact 18 is connected with supply conductor 16, which as previously mentioned is connected to ground. Thus, when the modules 1 and 2 are interconnected via multiconductor cable 11, a ground signal of zero volts is fed via the signal conductor 20, signal contact 13, and signal line 12 to logic and evaluation circuit 3. By evaluating the potential being applied to the line 12, logic and evaluation circuit 3 is able to detect and determine whether or not a target module 2 is connected to starting module 1.

Furthermore, connecting element 7 has a supplementary signal contact 21, which is connected via supplementary signal line 22 to logic and evaluation circuit 3 and can be connected to supplemental signal conductor 24 of multiconductor cable 11. Supplementary signal line 22 is also connected via supplementary pull resistor 23 to +5 volts. The voltage on line 22 is used by logic and evaluation circuit 3 to determine whether or not the length of the preassembled multiconductor cable is shorter than a critical cable length of, for example, one meter. When the cable length is shorter than a critical length, supplemental signal conductor 24 of multiconductor cable 11 is connected in one or both of the mating connectors 9 and 10 via electrically conductive bridge circuits 25 and 26 to supply conductor 16. Therefore, when the specific cable length of multiconductor cable 11 is shorter than a critical length, a ground signal is fed via supplementary signal line 22 to logic and evaluation circuit 3. Logic and evaluation circuit 3 then increases the speed of the data transfer via lines 5, 6 and 11'. Otherwise, a signal of +5 volts is applied to the supplementary signal line 22, and data transfer rates are set lower.

As is furthermore apparent from the drawing figure, modules 1 and 2 have a completely identical design. Thus, target module 2 has all the elements of starting module 1, so that target module 2 can also be used as a starting module for another module (not shown) to be linked via cable 27. In the same way, the starting module 1 could be connected via cable 28 to another module (not shown) and serve as a target module.

What is claimed is:

1. A module of an electrical unit comprising:
  a. an evaluation circuit for evaluating a first multiconductor cable during normal operation; and
  b. a first communication interface electroconductively connecting said module to a first end of the first multiconductor cable, said first communication interface comprising
    i. a first supply cable contact connected to a first supply potential for electroconductively coupling the first end of the first multiconductor cable to said module,
    ii. a signal line,
    iii. a first signal cable contact connected to said evaluation circuit via said signal line, said signal cable contact for electroconductively coupling the first end of the first multiconductor cable to said evaluation circuit via said signal line and accepting an input signal from the first multiconductor cable to be fed to said evaluation circuit, and
    iv. a pull-up resistor connecting said signal line to a second supply potential; and
  c. a second communication interface electroconductively connecting said module to a second multiconductor cable and including
    i. a second supply cable contact for connecting to a supply potential via a first conductor of the second multiconductor cable, and
    ii. a second signal cable contact for connecting to a second conductor of the second multiconductor cable,
    iii. said second signal cable contact electroconductively connected to said second supply cable contact.

2. The module of claim 1, further comprising
  a. a supplementary signal cable contact capable of receiving an input signal from the first multiconductor cable;
  b. a supplementary signal line connecting said supplementary signal cable contact to said evaluation circuit, said supplementary signal cable contact for electroconductively coupling the first end of the first multiconductor cable to said evaluation circuit via said supplementary signal line;
  c. a pull-up resistor connecting said supplementary signal line to the second supply potential.

3. A system comprising:
  a. a multiconductor cable;
  b. a first module for evaluating said multiconductor cable during normal operation including
    i. a first evaluation circuit; and
    ii. a first communication interface electroconductively connecting said first module to a first end of said multiconductor cable and including,
      a. a supply cable contact connected to a first supply potential for electroconductively coupling the first end of the multiconductor cable to the first module,
      b. a signal line,
      c. a signal cable contact connected to said evaluation circuit via said signal line, said signal cable contact for electroconductively coupling the first end of the multiconductor cable to said evaluation circuit via said signal line and accepting an input signal from the multiconductor cable to be fed to said evaluation circuit, and
      d. a pull-up resistor connecting said signal line to a second supply potential; and
  c. a second module including,
    i. a second communication interface connecting said second module to a second end of the multiconductor cable and including
      a. at least one supply cable contact for connecting to a supply potential via a first conductor of the multiconductor cable, and
      b. at least one signal cable contact for connecting to a second conductor of the multiconductor cable,
      c. said at least one signal cable contact being electroconductively connected to said at least one supply cable contact.

4. The system of claim 3 wherein said first module further includes:
  a. a supplementary signal cable contact for receiving an input signal from the multiconductor cable;
  b. a supplementary signal line connecting said supplementary signal cable contact to said evaluation circuit, the supplementary signal cable contact for electroconductively coupling the first end of the multiconductor cable to the evaluation circuit via the supplementary signal line; and
  c. a pull-up resistor connecting said supplementary signal line to the second supply potential.

5. The system of claim 4 wherein said first module further comprises a second communication interface including,
  a. a second supply cable contact able to be connected to a second supply potential via a first conductor of another multiconductor cable,
  b. a second signal cable contact able to be connected to a second conductor of another multiconductor cable,
  c. said second signal cable contact being electroconductively connected to said second supply contact.

6. The system of claim 4 wherein said second module further comprises:
  a. a second evaluation circuit; and
  b. a second communication interface electroconductively connecting said second module to a first end of another multiconductor cable and including
    i. a second supply cable contact connected to a third supply potential for electroconductively connecting the first end of the other multiconductor cable to the second module,
    ii. a second signal line,
    iii. a second signal cable contact connected to said second evaluation circuit via said second signal line, said second signal cable contact for electroconductively connecting the first end of the other multiconductor to said second evaluation circuit via the second signal line and accepting an input signal from the other multiconductor cable to be fed to said second evaluation circuit and
    iv. a pull-up resistor connecting said signal line to a fourth supply potential.

7. The system of claim 3 wherein said second module further comprises:
  a. a second evaluation circuit; and
  b. a second communication interface for electroconductively connecting said second module to a first end of another multiconductor cable and including
    i. a second supply cable contact connected to a third supply potential for electroconductively coupling the first end of the other multiconductor cable to the second module, ii. a second signal line, iii. a second signal cable contact connected to said evaluation circuit via said second signal line, the second signal cable contact for electroconductively coupling the first end of the other multiconductor cable to the second evaluation circuit and accepting an input signal from the other multiconductor cable to be fed to said second evaluation circuit and iv. a pull-up resistor connecting said second signal line to a fourth supply potential.

8. The system of claim 3 wherein said first module further comprises a second communication interface including, a. a second supply cable contact able to be connected to a second supply potential via a first conductor of another multiconductor cable, b. a second signal cable contact able to be connected to a second conductor of another multiconductor cable, c. said second signal cable contact being electroconductively connected to said second supply cable contact.

9. The system of claim 8 wherein said second module further comprises:

a. a second evaluation circuit; and b. a second communication interface electroconductively connecting said second module to a first end of another multiconductor cable and including i. a second supply cable contact connected to a third supply potential for electroconductively coupling the first end of the other multiconductor cable to the module, ii. a second signal line, iii. a second signal cable contact connected to said second evaluation circuit via said second signal line, said second cable contact for electroconductively coupling the first end of the other multiconductor cable to said second circuit via the second signal line and accepting an input signal from the other multiconductor cable to be fed to said evaluation circuit and iv. a pull-up resistor connecting said second signal line to a fourth supply potential.

* * * * *